US009355744B2

(12) United States Patent
Chang et al.

(10) Patent No.: US 9,355,744 B2
(45) Date of Patent: May 31, 2016

(54) DYNAMIC MEMORY SIGNAL PHASE TRACKING METHOD AND ASSOCIATED CONTROL CIRCUIT

(71) Applicant: MStar Semiconductor, Inc., Hsinchu Hsien (TW)

(72) Inventors: Yung Chang, Hsinchu (TW); Chen-Nan Lin, Taipei (TW); Chung-Ching Chen, Hsinchu (TW)

(73) Assignee: MSTAR SEMICONDUCTOR, INC., Hsinchu County (TW)

( * ) Notice: Subject to any disclaimer, the term of this patent is extended or adjusted under 35 U.S.C. 154(b) by 132 days.

(21) Appl. No.: 14/321,039

(22) Filed: Jul. 1, 2014

(65) Prior Publication Data

US 2015/0006807 A1 Jan. 1, 2015

(30) Foreign Application Priority Data

Jul. 1, 2013 (TW) ............................ 102123480 A

(51) Int. Cl.

*G06F 12/00* (2006.01)
*G11C 29/02* (2006.01)
*G06F 13/00* (2006.01)
*G06F 13/28* (2006.01)

(52) U.S. Cl.

CPC ............ *G11C 29/022* (2013.01); *G11C 29/023* (2013.01); *G11C 29/028* (2013.01)

(58) Field of Classification Search

CPC ... G11C 29/022; G11C 29/023; G11C 29/028
USPC ......................................................... 711/106
See application file for complete search history.

(56) References Cited

U.S. PATENT DOCUMENTS 5,948,083 A * 9/1999 Gervasi ................ H04L 7/0337 375/334
6,463,488 B1 * 10/2002 San Juan ............ G06F 11/2221 710/107
6,467,043 B1 * 10/2002 LaBerge ............. G11C 7/1051 713/400
6,889,334 B1 * 5/2005 Magro ................ G11C 7/1051 324/130
7,450,443 B2 * 11/2008 Cheng ..................... G11C 7/22 327/2
7,965,567 B2 * 6/2011 Hampel .................. G11C 7/10 365/149
2004/0183517 A1 * 9/2004 Reilly ............... G01R 31/3016 324/76.11
2009/0043953 A1 * 2/2009 Tseng ................. G11C 7/1051 711/105

FOREIGN PATENT DOCUMENTS

TW 200907673 2/2009

* cited by examiner

*Primary Examiner* — Mark Giardino, Jr.

(74) *Attorney, Agent, or Firm* — WPAT, P.C.; Justin King; Jonathan Chiang

(57) ABSTRACT

A dynamic memory signal phase tracking method is provided. The method, applied to a memory controller that accesses a memory module, includes: issuing a memory access command and an access request to an arbiter to request for an access right of the memory module; when the access right is obtained, forwarding the memory access command to the memory module and asserting a flag signal; during a period of asserting the flag signal, sequentially using a plurality of candidate delay phases to adjust a memory signal for latching test data from the memory module, determining a delay phase according to latching results corresponding to the candidate delay phases, and recording the determined delay phases; updating an optimal delay phase according to the determined delay phase; and accessing the memory module according to the updated optimal delay phase.

14 Claims, 5 Drawing Sheets

Start
602 BIST unit issuing memory access command and access request to arbitration unit
604 Access right is obtained? No / Yes
606 Sending multiple NOP commands in memory access command and controlling flag signal to operate
608 Phase switching unit adjusts delay phase when flag signal operates
610 Adjusting memory signal according to delay phase to latch output data from DDR memory module
612 Determining latched data and record latched data to phase calculator
614 Phase calculator needs to change optimal delay phase? No / Yes
616 Updating optimal delay phase when DDR memory module is not in data access procedure

DYNAMIC MEMORY SIGNAL PHASE TRACKING METHOD AND ASSOCIATED CONTROL CIRCUIT

This application claims the benefit of Taiwan application Serial No. 102123480, filed Jul. 1, 2013, the subject matter of which is incorporated herein by reference.

BACKGROUND OF THE INVENTION

1. Field of the Invention

The invention relates in general to a memory control circuit and an associated control method, and more particularly to a dynamic memory signal phase tracking method and an associated control circuit.

2. Description of the Related Art

A memory controller, generally connected to a memory module, writes data into the memory module or reads data from the memory module. One of the most common memory modules is a double data rate (DDR) memory module.

When the memory controller issues a write command, data can be sent from the memory controller to the memory module to be stored therein. When the memory controller issues a read command, data can be sent from the memory module to the memory controller for subsequent processes.

FIG. 1 shows a schematic diagram of connections between a memory controller and a memory module. Signals between a memory controller 100 and a DDR memory module 200 at least include an external clock CLKext, address signals, a command signal, serial data signals DQ0 to DQ7, and a data strobe signal DQS. The command signal includes a write enable signal WE, the address signals include memory address signals A0 to A13, a row address strobe signal RAS and a column address strobe signal CAS.

A DDR transaction includes the following steps. The memory controller 100 first issues the command signal and the address signals, and the DDR module 200 obtains a command according to the command signal and the address signals. The command signal may be a write command or a read command. The DDR memory module 200 then stores or outputs data according to the command.

When the command is a write command, the serial data signals DQ0 to DQ7 and the data strobe signal DQS are generated by the memory controller 200. Thus, the DDR memory module 200 latches data on the serial data signals DQ0 to DQ7 according to the data strobe signal DQS generated by the memory controller 100, and writes the latched data into corresponding memory addresses in the DDR memory module 200.

A period from the memory module 200 receives the read command to a time point where data is ready for output is referred to as a column address strobe (CAS) latency CL. Take an example of CL=2. When the command is a read command, the DDR memory module 200 only drives the serial data signals DQ0 to DQ7 after two periods of the external clock CLKext. At this point, the memory controller 100 may latch the serial data signals DQ0 to DQ7 according to the data strobe signal DQS and obtain data in the corresponding memory addresses.

FIG. 2 shows a signal timing diagram when reading a command. In general, when the DDR memory module 200 outputs data, the data strobe signal DQS and the serial data signals DQ0 to DQ7 are generated. At this point, a frequency of the data strobe signal DQS is the same as that of the external clock signal CLKext. Conversely, before the DDR memory module 200 outputs data, the data strobe signal DQS is in a high-impedance tri-state.

As observed from FIG. 2, at a time point T0, the memory addresses A0 to A13 and the read command Read are obtained from the address signal and the command signal, whereas a no operation command NOP is obtained at other time points. The CAS latency CL is two external clock CLKext periods (CL=2). Thus, the data strobe signal DQS changes from a tri-state to a low level at the time point T1, alternates between high and low levels between time points T2 and T4, and again changes to a tri-state at the time point T4. After the CAS latency of two external clocks CLXext (CL=2), data D0, D1, D2 and D3 is sequentially generated on the serial data signals DQ0 to DQ7 from the time point T2 to the time point T4. As such, the memory controller 100 may latch the data D0, D1, D2 and D3 on the serial data signals DQ0 to DQ7 according to rising and falling edges of the data strobe signal DQS.

Theoretically, the memory controller 100 may delay the phase of the received data strobe signal DQS by 90 degrees to latch the serial data signals DQ0 to DQ7. However, due to variations and errors in a layout of a printed circuit board, and manufacturing processes and voltages of circuits in the memory controller 100, as well as other external factors (e.g., the ambient temperature), memory signals may be caused to drift, e.g., the serial data signals DQ0 to DQ7 are caused to drift. As a result, the serial data signals DQ0 to DQ7 may not be normally accessed after the phase of the data strobe signal DQS is delayed by 90 degrees.

FIG. 3 shows a schematic diagram of an eye pattern of the serial data signal DQ and the data strobe signal DQS received by the memory controller 100. Due to the drift in the memory signals, the memory controller 100 is required to set an optimal delay phase of the data strobe signal DQS before its normal operations begin, so that the data strobe signal DQS may correctly latch the serial data signal DQ. In other words, before the memory controller 100 enters a normal operation mode, the memory controller 100 needs to perform a scanning test to establish a DQS latch interval of the data strobe signal DQS.

When performing the scanning test, the memory controller 100 gradually changes the delay phase of the data strobe signal DQS and accordingly accesses data in the DDR memory module 200. As shown in FIG. 3, when the delay phase of the data strobe signal DQS is between t1 and t2, the data in the DDR memory module 200 can be correctly accessed. A range as the delay period between t1 and t2 is referred to as a DQS latching interval.

Having confirmed the DQS latching interval, the optimal delay phase of the data strobe signal DQS can be accordingly set to ta, where ta=(t1+t2)/2. That is, the data strobe signal DQS is set to a center of the DQS latching interval, thereby ensuring the memory controller 100 to correctly access the data in the DDR memory module 200 when the memory controller 100 operates in the normal operation mode. When the phase setting of the data strobe signal DQS is complete, the entire system is then allowed to be activated to enter the normal operation mode.

In actual situations, when the entire system continues working, different system loads affects internal currents and temperature distributions in the circuits, and even a situation with drastic fluctuations in the ambient temperature may affect the quality of signals between the memory controller 100 and the DDR memory module 200, causing the memory signals to drift more severely. At this point, the DQS latching interval may be shifted or even reduced.

In the prior art, before normal operations are activated, the optimal delay phase of the data strobe signal DQS is set and cannot be modified. Thus, when the entire system continues working, in response to the change in the DQS latching interval, the data strobe signal DQS may fail to access the data in the DDR memory module 200 according to the previously set optimal phase delay.

SUMMARY OF THE INVENTION

The invention is directed to a dynamic memory signal phase tracking method and an associated control circuit. In normal operations, a memory controller is capable of constantly tracking a DQS latching interval and accordingly updating an optimal delay phase of a data strobe signal DQS.

The present invention discloses a dynamic memory signal phase tracking method for a memory controller to access a memory module. The method includes: issuing a memory access command and an access request to request an arbiter for an access right of the memory module; when the access right is obtained, forwarding the memory access command to the memory module and asserting a flag signal; during a period of asserting the flag signal, sequentially using a plurality of candidate delay phases to adjust a memory signal for latching test data from the memory module, determining a delay phase according to latching results corresponding to the candidate delay phases, and recording the determined delay phases; updating an optimal delay phase according to the determined delay phase; and accessing the memory module according to the updated optimal delay phase.

The present invention further discloses a memory controller. The memory controller includes: an arbiter; a test unit, configured to issue a memory access command and an access request to the arbiter to request for an access right of the memory module; an input/output control unit, configured to access the memory module according to a memory signal; a phase switching unit, configured to adjust the memory signal; and a control unit, configured to control the arbiter, the test unit, the input/output control unit and the phase switching unit. When the test unit obtains the access right, the control unit asserts a flag signal to the phase switching unit. During a period of asserting the flag signal, the phase switching unit accordingly sequentially uses a plurality of candidate delay phases to adjust the memory signal, the input/output control unit latches test data from the memory module according to the adjusted memory signal, and the test unit determines a delay phase according to latching results corresponding to the plurality of candidate delay phases, and records the determined delay phase. The test unit further updates an optimal delay phase according to the recorded determined delay phase and the input/output control unit further accesses the memory module according to the updated optimal delay phase.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
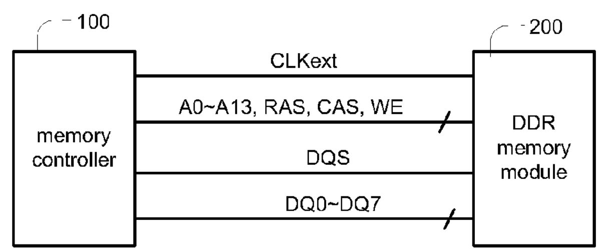
FIG. 1 is a schematic diagram of connections between a memory controller and a memory module.
Figure 2:
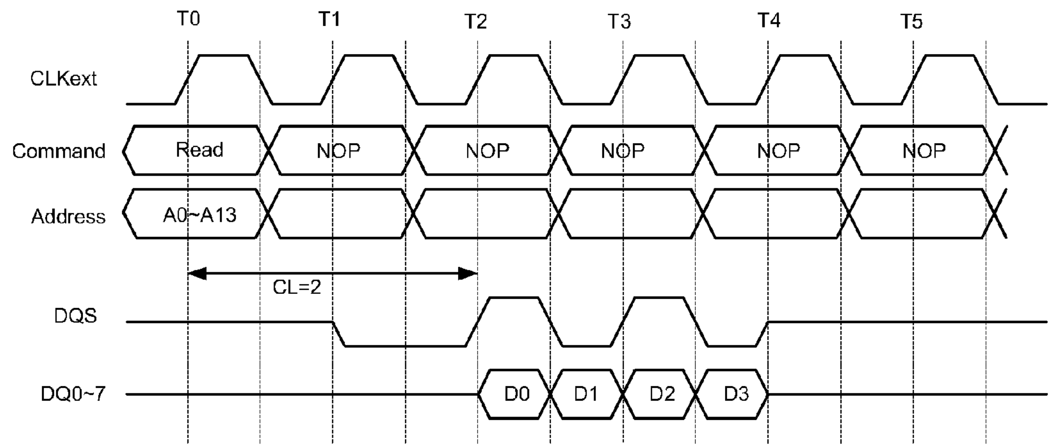
FIG. 2 is a signal timing diagram when reading a command.
Figure 3:
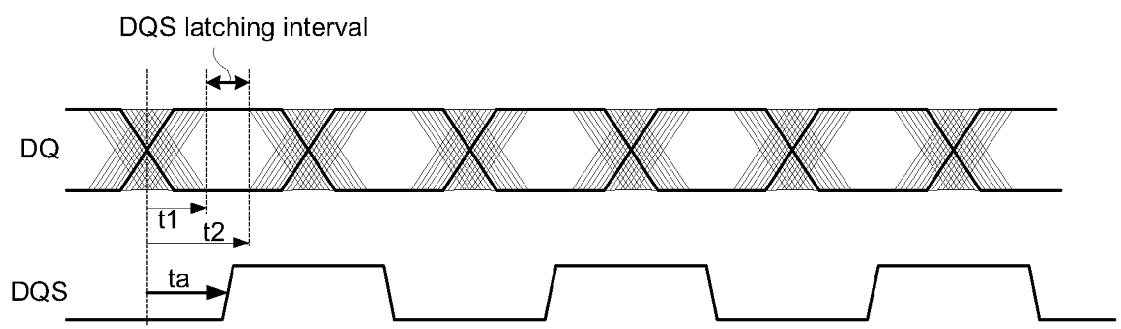
FIG. 3 is a schematic diagram of an eye pattern of a serial data signal DQ and a data strobe signal DQS received by a memory controller.
Figure 4:
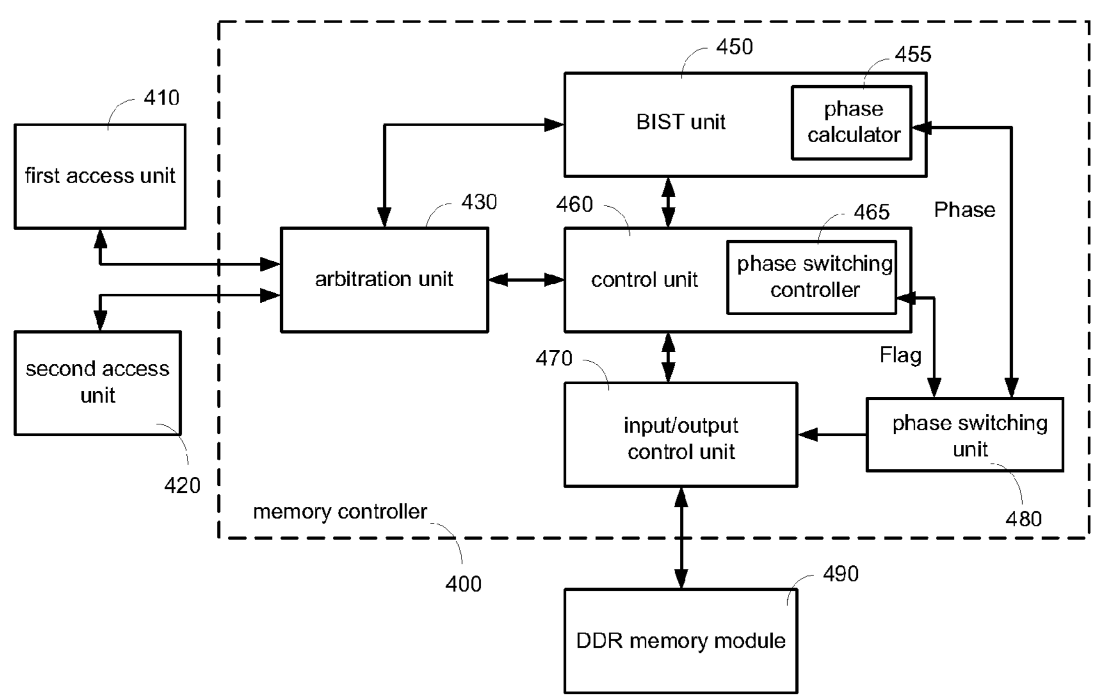
FIG. 4 is a schematic diagram of a memory access system that applies a memory controller according to an embodiment of the present invention.

FIG. 4 shows a schematic diagram of a memory access system that applies a memory controller 400 of the present invention. The memory access system includes a first access unit 410 and a second access unit 420 connected to the memory controller 400. The memory controller 400 is connected to a DDR memory module 490. In normal operations, the first access unit 410 and the second access unit 420 can access data in the DDR memory module 490 as desired. For example, the first access unit 410 and the second access unit 420 may be central processing units (CPUs), digital television (DTV) controllers, or USB interface controllers.

The memory controller 400 includes an arbitration unit 430, a built-in self-test (BIST) unit 460, an input/output control unit 470, and a phase switching unit 480.

In an embodiment, before the memory access system starts normal operations, a scanning test is performed to confirm a DQS latching interval and to accordingly set an optimal delay phase of the data strobe signal DQS.

During the scanning test, the arbitration unit 430 is not activated. The BIST unit 450 first issues a write command to store test data via the control unit 460, the input/output control unit 470 to the DDR memory module 490. The BIST unit 450 further controls the phase switching unit 480 to constantly adjust the delay phase of the data strobe signal DQS that the input/output control unit 470 receives, so as to enable the control unit 460 to latch the test data from the DDR memory module 490 and to send the test data to the BIST unit 450.

When the BIST unit 460 successfully accesses the test data from the DDR memory module 490, it means that the delay phase of the data strobe signal DQS at this point falls within the DQS latching interval. Conversely, when the BIST unit 460 fails to access the test data from the DDR memory module 490, it means that the delay phase of the data strobe signal DQS at this point falls outside the DQS latching interval.

When the scanning test is complete, the BIST 460 has established a DQS latching interval, and may set and provide the optimal delay phase of the data strobe signal DQS to the phase switching unit 480. Next, the input/output control unit 470 accordingly delays the data strobe signal DQS and renders the memory access system to enter the normal operation mode.

In the normal operation mode, both of the first access unit 410 and the second access unit 420 are capable of issuing a memory access command and an access request to the DDR memory module 490. The arbitration unit 430 determines whether the first access unit 410 or the second access unit 420 has the access right to the DDR memory module 490 according to a predetermined access priority.

In the embodiment, when the first access unit 410 has the access right for accessing the DDR memory module 490, the memory access command issued by the first access unit 410 is transmitted via the control unit 460 and the input/output control unit 470 to the DDR memory module 490. When the DDR memory module 490 generates output data, the input/output control unit 470 delays the data strobe signal DQS by the optimal delay phase that the phase switching unit 480 provides, and provides the delayed data strobe signal DQS to the control unit 460. At this point, the control unit 460 obtains the data outputted from the DDR memory module 490 according to the delayed data strobe signal DQS and the serial data signal DQ. The output data is forwarded to the first access unit 410 via the arbitration unit 430. It should be noted that, the memory controller 400 may be connected to a larger number of external access units, and the arbitration unit 430 may determine which of the external access units has the access right for accessing the DDR memory module 490. For example, the memory access command at least includes a write command, a read command and a no operation command.

In the embodiment, the BIST unit 450 is further connected to the arbitration unit 430, and tracks the data strobe signal DQS when the memory controller 400 is in normal operations. That is, during the scanning test, the BIST unit 450 performs a delay phase test on the tracked data strobe signal DQS. In the normal operation mode, the BIST unit 450 needs to be granted with the access right in order perform the delay phase test on the tracked data strobe signal DQS.

The BIST 450 also requires the access right granted by the arbitration unit 430 to adjust the data strobe signal DQS. In general, the BIST unit 450 may be set to have a lower priority That is, only when neither the first access unit 410 nor the second access unit 420 accesses the data of the DDR memory module 490, the BIST unit 450 is allowed to adjust the data strobe signal DQS.

The control unit 460 includes a phase switching controller 465 that generates a flag signal (Flag) to the phase switching unit 480. Only when the flag signal (Flag) is asserted, the phase switching unit 480 can then accordingly control the input/output control unit 470 to delay the data strobe signal DQS. The BIST unit 450 further includes a phase calculator 455 that generates a phase signal (Phase) to the phase switching unit 480. When the flag signal (Flag) is asserted, the phase switching unit 480 controls the input/output control unit 470 according to the phase signal (Phase) to delay the data strobe signal DQS by a predetermined phase.

In normal operations, when the BIST unit 450 successfully accesses the test data from the DDR memory module 490, it means the delay phase of the data strobe signal DQS at this point falls within the DQS latching interval. Conversely, when the BIST unit 450 fails to access the test data from the DDR memory module 490, it means the delay phase of the data strobe signal DQS at this point falls outside the DQS latching interval. Therefore, under normal operations, the memory controller 400 may also dynamically track the data strobe signal DQS. When the BIST unit 450 confirms that the DQS latching interval is changed, the BIST unit 450 updates the optimal delay phase to prevent an erroneous access of the DDR memory module 490.

Figure 5:
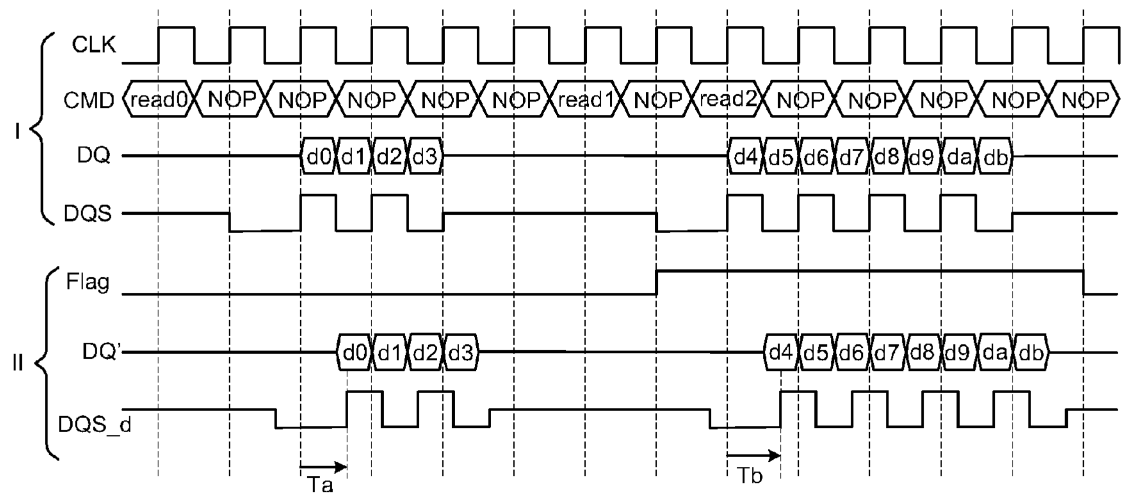
FIG. 5 is a schematic diagram of associated signals of a memory controller in normal operations according to an embodiment of the present invention.

FIG. 5 shows a schematic diagram of associated signals when a memory controller is in normal operations according to an embodiment of the present invention. Signals of a group I are signals generated by the DDR memory module 490, and signals of a group II are signals adjusted by the memory controller 400.

As shown, an external access unit (e.g., the first access unit 410 or the second access unit 420) accesses the DDR memory module 490. As shown by the signals of the group I, the DDR memory module 490 generates data d0 to d3 and the data strobe signal DQS in the serial data signal DQ according to a read command (read0). As shown by the signals of the group II, the memory controller 400 delays the data strobe signal DQS by an optimal delay phase (Ta) to a delayed data strobe signal DQS_d for accordingly latching the data d0 to d3. The optimal delay phase (Ta) is determined during a scanning test.

When the BIST unit 450 wishes to adjust the phase of the data strobe signal DQS, the BIST unit 450 accesses the DDR memory module 490 through read commands (read1) and (read2). Thus, as shown by the signals of the group I, the DDR memory module 490 generates data d4 to db and the data strobe signal DQS in the serial data signal DQ. As shown by the signals of the group II, the flag signal (Flag) in the memory controller 400 is asserted to indicate that the phase switching unit 480 may adjust the phase of the data strobe signal DQS. As such, the data strobe signal DQS is delayed by another delay phase (Tb) to a delayed data strobe signal DQS_d for accordingly latching the data d4 to db. In the embodiment, when the flag signal (Flag) is de-asserted, the delay phase in the memory controller 400 restores to the optimal delay phase (ta) for accordingly latching the output data from the DDR memory module 490. In other words, given the optimal delay phase is not change, when the flag signal (Flag) is de-asserted, the memory controller 400 restores to the optimal delay phase (Ta) determined during the scanning test.

After multiple phase adjustments performed by the BIST unit 450, test results are recorded in the phase calculator 455. When the phase calculator 455 learns that the DQS latching interval is changed according to the above test results, the BIST unit 450 may again calculate the optimal delay phase. The memory controller 400 may change the optimal delay phase when the DDR memory module 490 is not in a data access procedure.

Preferably, the read commands of BIST unit 450 and the external access unit (e.g., the first access unit 410 or the second access unit 420) may be separated by multiple no operation commands NOP, so as to ensure that the external access unit (e.g., the first access unit 410 or the second access unit 420) adjusts the delay of the data strobe signal DQS only after having received the accessed data.

Figure 6:
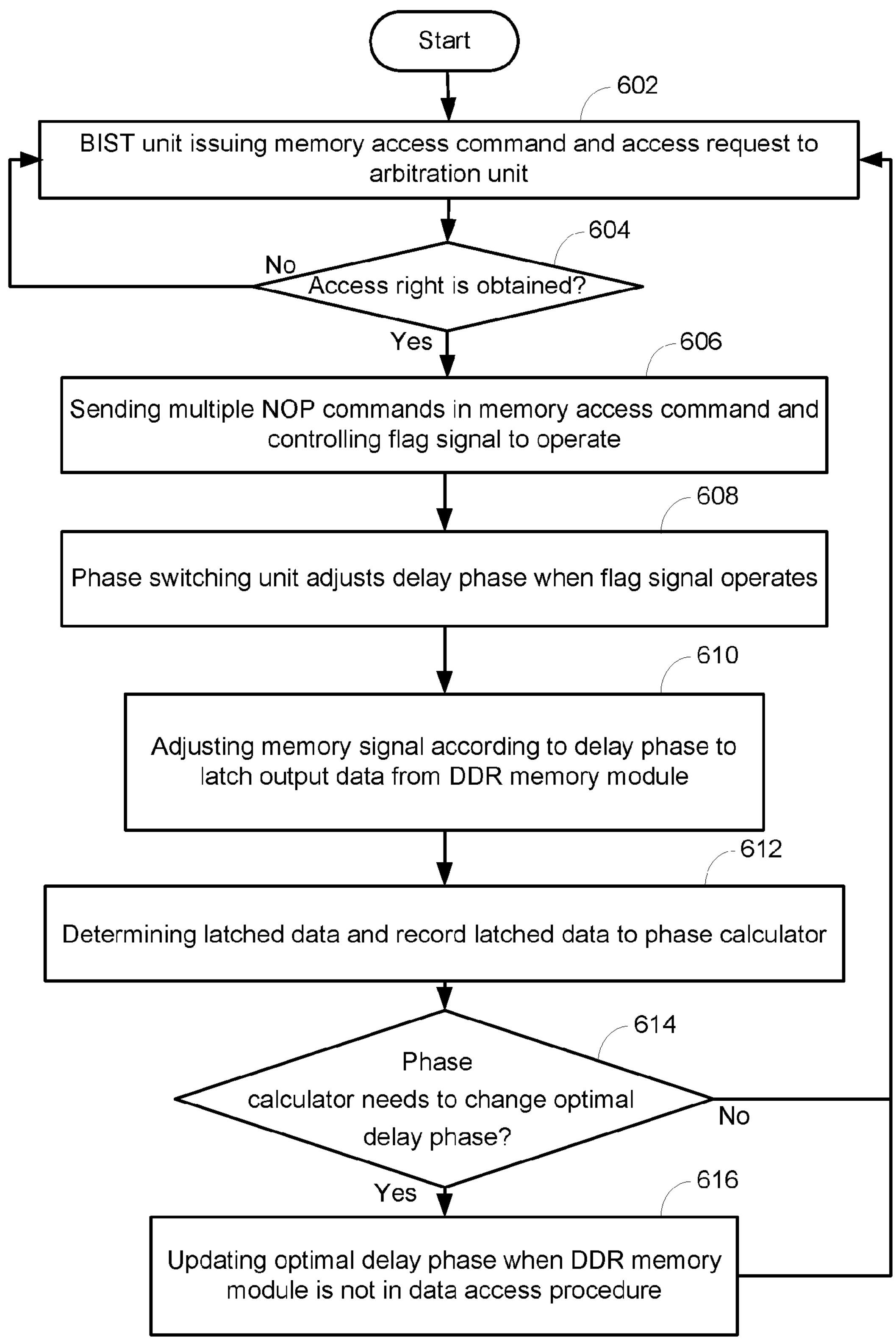
FIG. 6 is a flowchart of a dynamic memory signal phase tracking method according to an embodiment of the present invention.

FIG. 6 shows a flowchart of a dynamic memory signal phase tracking method according to an embodiment of the present invention. The method is applied to the memory controller 400 in normal operations. For example, the memory signal is the DQS signal. In other embodiments, other memory signals may be delayed and tracked.

When the process of the method begins, a BIST unit issues a memory access command and an access request to an arbitration unit (step S602). When the arbitration unit does not grant the access right at step S604, the process returns to step S602. Conversely, when the arbitration unit grants the access right at step S604, the arbitration unit first sends multiple no operation commands (NOP) in the memory access command, and controls the flag signal (Flag) to be asserted (step S606).

When the flag signal (Flag) is controlled to be asserted, a phase switching unit adjusts a delay phase (step S608). A memory signal (e.g., the data strobe signal DQS) is adjusted according to the delay phase and output data from a DDR memory module is accordingly latched (step S610). The BIST unit then determines the latched data and records the latched data to a phase calculator (step S612).

When a number of determination records are not yet accumulated in the phase calculator, whether the DQS latching interval is changed cannot be determined. That is, the phase calculator needs to accumulate a number of determination records in order to determine whether the DQS latching interval is changed to accordingly change the optimal delay phase. When the phase calculator need not change the optimal delay phase (step S614), the process returns to step S602 to have the BIST unit to continue issuing a memory access command to the arbitration unit and to further perform phase adjustment of the memory. Conversely, when the phase calculator needs to adjust the optimal delay phase (step S614), the optimal delay phase is adjusted when the DDR memory module is not in a data access procedure. The process then returns to step S602 to continue the phase adjustment of the memory.

By updating the optimal delay phase when the DDR memory module is not in a data access procedure, it is ensured that errors are not incurred in future data access procedures. Preferably, the optimal delay phase may be updated during a refresh. Thus, after updating the optimal delay phase, the latest optimal delay phase may be utilized to adjust the memory signal (the data strobe signal DQS) to latch the output data from the DDR memory module.

A dynamic memory signal phase tracking method and an associated control circuit are disclosed by the above description. In normal operations, the memory controller is capable of constantly tracking the DQS latching interval and accordingly updating the optimal delay phase of the data strobe signal DQS, so as to prevent the DDR memory module from erroneous data access.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A dynamic memory signal phase tracking method, applied to a memory controller that accesses a memory module, the method comprising:

issuing a first memory access command and a first access request to an arbiter to request for a first access right of the memory module;

issuing a second memory access command and a second access request to an arbiter to request for a second access right of the memory module;

when the first access right is obtained, forwarding the first memory access command to the memory module and asserting a flag signal;

during a period of asserting the flag signal, sequentially using a plurality of candidate delay phases to adjust a memory signal for latching test data from the memory module, determining a delay phase according to latching results corresponding to the plurality of candidate delay phases, and recording the determined delay phase;

updating an optimal delay phase according to the recorded determined delay phase; and accessing the memory module according to the updated optimal delay phase.

2. The method according to claim 1, further comprising:

during another period of asserting the flag signal, determining another delay phase and recording the another determined delay phase;

wherein the step of updating an optimal delay phase further according to the another recorded determined delay phase.

3. The method according to claim 1, wherein the first memory access command comprises a plurality of no operation commands.

4. The method according to claim 1, wherein the memory module is a double data rate (DDR) memory module, and the memory signal is a data strobe signal.

5. The method according to claim 1, wherein the step of updating the optimal delay phase is processed when the memory module is not in a data access procedure.

6. The method according to claim 1, wherein the step of updating the optimal delay phase is processed when the memory module is performing a refresh operation.

7. A memory controller, coupled to a memory module, comprising:

an arbiter;

a test unit, configured to issue a first memory access command and a first access request to the arbiter to request for a first access right of the memory module;

an access unit, coupled to the arbiter, configured to issue a second memory access command and a second access request for a second access right of the memory module, wherein the test unit has a lower priority than said access unit;

an input/output control configured to access the memory module according to a memory signal;

a phase switching unit, configured to adjust the memory signal; and a control unit, configured to control the arbiter, the test unit, the input/output control unit and the phase switching unit;

wherein, when the test unit obtains the first access right, the control unit asserts a flag signal to the phase switching unit;

wherein, during a period of asserting the flag signal, the phase switching unit accordingly sequentially uses a plurality of candidate delay phases to adjust the memory signal, the input/output control unit latches test data from the memory module according to the adjusted memory signal, and the test unit determines a delay phase according to latching results corresponding to the plurality of candidate delay phases, and records the determined delay phase; and wherein, the test unit further updates an optimal delay phase according to the recorded determined delay phase and the input/output control unit further accesses the memory module according to the updated optimal delay phase.

8. The memory controller according to claim 7, wherein during another period of asserting the flag signal, the test unit further determines another delay phase, records the another determined delay phase, and updates the optimal delay phase according to the another recorded determined delay phase.

9. The memory controller according to claim 7, wherein the test unit records the determined delay phase in a phase calculator, and updates the optimal delay phase according to a calculating result generated by the phase calculator.

10. The memory controller according to claim 7, wherein when the flag signal is de-asserted, the memory controller adjusts the memory signal by the updated optimal delay phase, and the input/output control unit accordingly accesses the memory module.

11. The memory controller according to claim 7, wherein the optimal delay phase is updated when the memory module is not in a data access procedure.

12. The memory controller according to claim 7, wherein the optimal delay phase is updated when the memory module performs a refresh operation.

13. The memory controller according to claim 7, wherein the first memory access command comprises a plurality of no operation commands.

14. The memory controller according to claim 7, wherein the memory module is a DDR memory module, and the memory signal is a data strobe signal.

* * * * *